(12) United States Patent
Lytle et al.

(10) Patent No.: US 6,949,398 B2
(45) Date of Patent: Sep. 27, 2005

(54) LOW COST FABRICATION AND ASSEMBLY OF LID FOR SEMICONDUCTOR DEVICES

(75) Inventors: William H. Lytle, Chandler, AZ (US); Owen Fay, Gilbert, AZ (US); Steven Markgraf, Plymouth, MN (US); Stephen B. Springer, Mesa, AZ (US)

(73) Assignee: Freescale Semiconductor, Inc., Schaumburg, IL (US)

( * ) Notice: Subject to any disclaimer, the term of this patent is extended or adjusted under 35 U.S.C. 154(b) by 258 days.

(21) Appl. No.: 10/286,441

(22) Filed: Oct. 31, 2002

(65) Prior Publication Data

US 2004/0087053 A1 May 6, 2004

(51) Int. Cl.$^7$ .............................................. H01L 21/00
(52) U.S. Cl. .......................... 438/55; 438/121; 438/124
(58) Field of Search ....................... 438/48–55, 106–127

(56) References Cited

U.S. PATENT DOCUMENTS

| | | | |
|---|---|---|---|
| 5,323,051 A | 6/1994 | Adams et al. ............... | 257/417 |
| 5,499,754 A | 3/1996 | Bobbio et al. ................ | 228/42 |
| 5,597,469 A | 1/1997 | Carey et al. ................ | 205/118 |
| 5,672,260 A | 9/1997 | Carey et al. ................ | 205/118 |
| 5,904,555 A | 5/1999 | Darbha et al. ............... | 438/613 |
| 6,121,689 A | 9/2000 | Capote et al. ............... | 257/783 |
| 2002/0000646 A1 * | 1/2002 | Gooch et al. ................ | 257/666 |

OTHER PUBLICATIONS

Michael B. Cohn, et al., "Microassembly Technologies for MEMS," University of California at BerkeleyUniversity of Washington, 15 pages, date unknown.

Carl Blake, et al., "High Current Voltage Regulator Module Employs Novel Packaging Technology to Achieve Over 100A in a Compact Footprint to Power Next Generation Servers," International Rectifier, 6 pages, presented at PCIM Europe 2002.

R.D. Gerke. Chapter 8: MEMS Radlag, pp. 166–191, date unknown.

Ken Gilleo, Positio Paper: MEMS Packaging Isuses. Cookson Electronics, 2 pages, date unknown.

* cited by examiner

*Primary Examiner*—H. Jey Tsai
(74) *Attorney, Agent, or Firm*—Fortkort Grether & Kelton LLP; John A. Fortkort

(57) ABSTRACT

A method is disclosed for encapsulating micromechanical elements or features on a substrate. In accordance with the method, a first substrate (111) is provided which has a patterned surface (113). A seed metallization (121) is then deposited onto the patterned surface, and a structural material layer (123), which preferably comprises copper, is electroplated onto the seed metallization. A solder (125), such as SnCu, is electroplated onto the metal layer, and the seed metallization, the structural material layer and the solder are removed from the first substrate as a cohesive structure (127), through the application of heat or by other suitable means, such that a negative replica of the patterned surface is imparted to the structure. The structure may then be placed on a second substrate (129) such that the solder is in contact with the second substrate, after which the solder is reflowed. Prior to reflow, the solder may be exposed to a fluorinated plasma, which forms a dry flux on the solder surface in the form of fluorinated metal oxides.

43 Claims, 3 Drawing Sheets

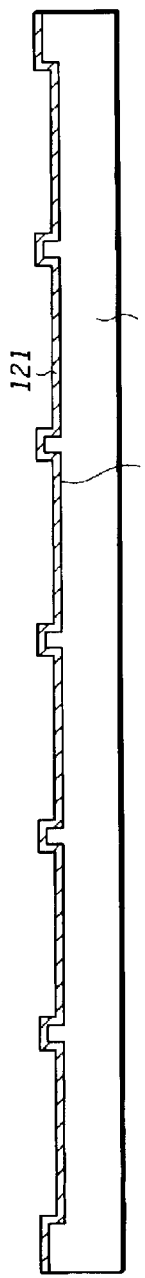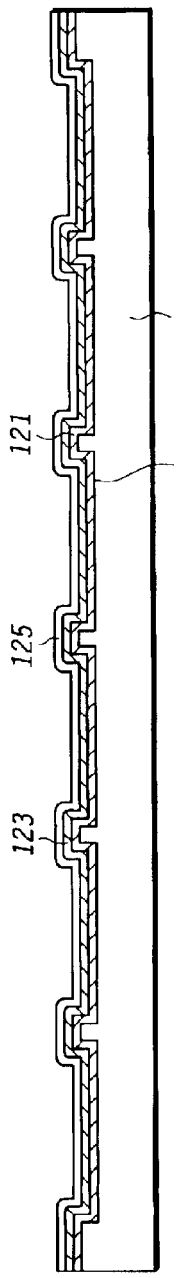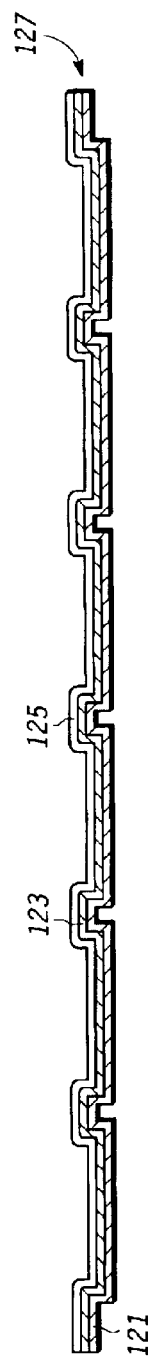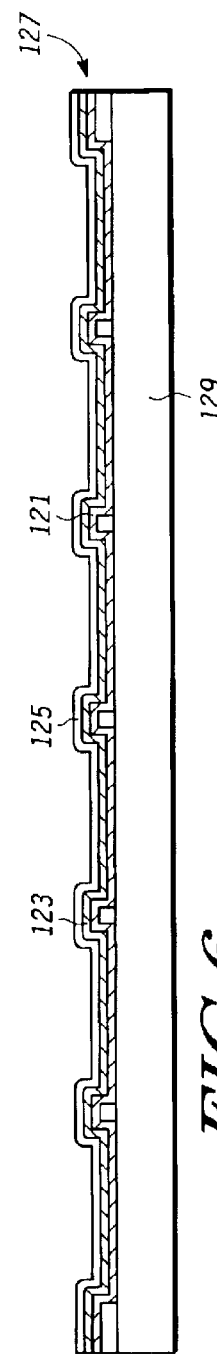

LOW COST FABRICATION AND ASSEMBLY OF LID FOR SEMICONDUCTOR DEVICES

FIELD OF THE INVENTION

The present invention relates generally to semiconductor device packaging, and more particularly to the packaging of semiconductor devices before wafer dicing.

BACKGROUND OF THE INVENTION

The application of integrated circuit manufacturing methods to produce micromachined parts and MicroElectroMechanical Systems (MEMS) has resulted in devices having a wide variety of microscopic mechanisms which are fabricated on the surface of a semiconductor wafer. Due to their size, these microscopic mechanisms are extremely vulnerable to damage from handling, small particles, moisture, air flow, and other environmental hazards. Consequently, these mechanisms are often encapsulated in a hermetically sealed package to prevent such damage.

One of the common processing steps in the fabrication of a semiconductor device is the dicing of the semiconductor wafer into individual chips which are then encapsulated in some form of package. It is desirable in many fabrication processes to encapsulate micromachined devices at the wafer level, that is, prior to separation of the wafer into individual chips. This approach is advantageous in that it avoids exposing the micromachined elements on the wafer to potential damage, either directly or through the introduction of debris, that may occur during the separation process. Wafer level encapsulation also allows the devices to be thoroughly tested in the actual encapsulated working environment of the device. This early and thorough testing, and the subsequent scrapping or reworking of defective devices, minimizes the expenditure of further processing resources on defective products.

In order for wafer level encapsulation to be feasible for a commercial scale wafer process, the encapsulation process must be compatible with commonly used die separation methods, such as wafer sawing. Ideally, the encapsulation process should also be inherently inexpensive and easy to implement. In particular, the process should allow for the use of simple, inexpensive packaging components and technologies. Many of the encapsulation technologies relied upon to date, however, are inherently complex and require the use of expensive materials.

FIG. 1 is a cross-sectional view of one type of prior art semiconductor wafer level package 21 that has been used to hermetically encapsulate a device 12. This type of device is described, for example, in commonly assigned U.S. Pat. No. 5,323,051 (Adams et al.). Typically, a plurality of such devices, together with external structures such as test devices and scribe channels, will be fabricated as part of the total semiconductor wafer level package. For the sake of clarity, however, these well known external structures have been omitted from the drawing and only the portion of the semiconductor wafer level package 21 which contains the device 12 is shown.

The device 12 of FIG. 1 is fabricated on a semiconductor substrate 11 which comprises a wafer of semiconductor material (at a later point in the fabrication process, after the device is completed and encapsulated, the wafer will be diced into a plurality of distinct chips). The device 12 may be any of the devices which are commonly fabricated on semiconductor wafers, including integrated circuit structures, micromachined sensors such as accelerometers, and other micromachined structures and MEMS devices.

A cap wafer 16 (typically ceramic) is provided which has a plurality of holes 18 extending through it. A plurality of glass walls 14 having a predetermined height and thickness are then formed on the cap wafer, and the cap wafer is bonded to the semiconductor substrate 11 by heating the cap wafer, the glass walls and the semiconductor substrate and using the glass walls as a bonding agent. In this way, the semiconductor wafer level package 21 is formed as a capped wafer structure with the device 12 hermetically sealed in a cavity 17 of predetermined dimensions formed by the semiconductor substrate, the cap wafer and the glass walls.

A plurality of metal traces 13 are fabricated on the semiconductor substrate 11 prior to formation of the glass walls 14. The metal traces form a plurality of electrodes on the semiconductor substrate which provide electrical coupling to the device 12. Since the metal traces bond firmly to the glass walls, they do not disrupt the integrity of the hermetic seal.

Prior to formation of the glass walls, holes 18 are etched in the cap wafer 16 in locations which provide ready access to a portion of the electrodes formed by the metal traces 13 that extend outside of the cavity 17. A plurality of wires 19 are bonded to a plurality of pads formed on exterior portions of metal traces. The wires extend through the holes and are themselves coupled to external electrical devices (not shown). The wires, holes and metal traces provide a plurality of electrical couplings to the device 12 while allowing the device to remain hermetically sealed within the cavity.

The two wafers are typically aligned by means of locating holes formed in each wafer into which an alignment pin is inserted during the bonding process. The capped wafer structure is then introduced into a controlled, pressurized environment which typically comprises an inert gas such as helium, argon or nitrogen. The cap wafer 16 and semiconductor substrate wafer 11 are heated in this environment to bond them together to form semiconductor wafer level package 21. The bonding hermetically seals the capped wafer structure capturing the inert gas within the cavity 17. The controlled environment provides a predetermined damping action for mechanical motion of the device 12. The predetermined damping action is readily controlled by altering the composition and pressure of the inert gas. The capped wafer structure is then diced into a plurality of composite chips by sawing, a method well known in the semiconductor art, and the composite chips are further encapsulated within a plastic material.

While the device and methodology disclosed in U.S. Pat. No. 5,323,051 (Adams et al.) represents a significant improvement in the art of hermetically sealed packages, it nonetheless has certain shortcomings. Most notably, this device generally involves the formation of a cavity which is defined by glass walls and a cap wafer. However, the formation of this cavity can be a costly and complicated process, and the formation of the walls and ceiling of the cavity directly on the wafer substrate can lead to contamination of, or damage to, the micromachined structures residing on the wafer substrate.

In some processes, the cavity in a device such as that disclosed in Adams et al. is sealed with a flat Kovar® lid. The use of Kovar® lids (which are based on Fe—Ni—Co alloys) is advantageous in that they shield the encapsulated device from RF interference. However, the use of Kovar® lids does not reduce the cost or complexity of the manufacturing process. In particular, in addition to the fabrication of the Kovar® lid itself (which typically requires electroplating, tack welding and reflow), the remainder of the cavity must still be fabricated, with the difficulties noted above.

There is thus a need in the art for a simplified and inexpensive method for encapsulating micromachined devices. There is also a need in the art for such a method which is applicable to the fabrication of packaging devices fabricated on a semiconductor wafer before the wafer is diced into individual chips, and which provides a hermetically sealed cavity within which micromachined device can move.

These and other needs are met by the structures and methodologies described herein.

SUMMARY OF THE INVENTION

In one aspect, a method is provided for encapsulating a micromechanical structure or device. In accordance with the method, a substrate is provided which has a plurality of micromechanical features disposed thereon. A structure is then formed which comprises an array of housing elements, and which preferably comprises a layer of solder. The structure, which preferably comprises a metal, may be formed, for example, by providing a first substrate having a patterned surface, forming (e.g., by electroplating) a metal layer on the first substrate such that a negative replica of the patterned surface is imparted to the metal layer, and removing the metal layer from the first substrate. The structure is then positioned over the substrate such that each micromechanical feature on the substrate is disposed within a housing element. The method may also further comprise the step of adhering the structure to the substrate such that each of the plurality of micromechanical features is hermetically sealed within a housing element. If the structure comprises a layer of solder, the hermetic seal may be obtained by reflowing the solder. After each of the plurality of micromechanical features has been hermetically sealed within a housing element, the array and substrate may be divided into separate hermetically sealed units, as by sawing or other suitable means.

In another aspect, a method is provided herein for encapsulating a micromechanical element or device. In accordance with the method, a first substrate is provided which has a patterned surface. The patterned surface may be, for example, in the shape of a negative replica of an array of housings for micromechanical devices. A seed metallization, which may comprise gold or other suitable metals, is then deposited onto the patterned surface, and a structural material layer is then formed on the seed metallization, preferably by electroplating. Copper is advantageous as a structural material from the standpoint that it plates easily, though in some applications, the use of a structural material that has a coefficient of thermal expansion (CTE) which more closely matches that of the substrate may be preferred. A solder, such as, for example, SnCu, is electroplated onto the structural material layer, and the structural material layer and solder are removed from the first substrate as a cohesive mass, as through the application of heat or by other suitable means. After removal, the structural material layer, which bears a negative replica of the patterned surface, may then be placed on a second substrate. The second substrate may be, for example, a semiconductor wafer having a plurality of micromechanical elements disposed thereon, and the structural material layer may be placed on the second substrate such that each micromechanical element is contained within a housing defined in the structural material layer and such that the solder is in contact with the second substrate. The solder is reflowed (preferably after exposing it to a fluorinated plasma, which reacts with the solder surface to form a dry flux thereon in the form of fluorinated metal oxides), thereby hermetically sealing each micromechanical element within a housing. The second substrate may then be diced into a plurality of hermetically sealed packages.

In another aspect, a method for encapsulating a micromechanical structure or device is provided. In accordance with the method, a substrate is provided which has a patterned or textured surface in the form of a 3-dimensional design thereon. A first metal layer is deposited on the patterned surface, after which a second metal layer is deposited onto the first metal layer. A layer of solder is then electroplated onto the second metal layer, after which the first and second metal layers and the solder layer are removed from the thermoplastic substrate as a cohesive structure. The structure is then placed on a second substrate such that the solder is in contact with the second substrate, and the solder is reflowed.

In yet another aspect, a method for encapsulating micromechanical elements and devices is provided. In accordance with the method, a patterned substrate, which preferably comprises a moldable or formable polymeric material such as PMMA, is provided which is used to define an array of metal housings having a portion of solder disposed on a surface thereof. The array is then removed from the patterned substrate as a cohesive mass and is placed on a semiconductor substrate having a plurality of micromechanical structures defined thereon such that each of the plurality of micromechanical elements is disposed within one of the metal housings within the array. The solder is then reflowed, thus encapsulating the micromechanical element in a hermetically sealed environment.

In still another aspect, a device is provided comprising a wafer or other semiconductor substrate having a plurality of RF MEMS sensors or other micromechanical structures thereon, and an array of metal housings, said array having a portion of solder disposed on a surface thereof and being positioned on the substrate such that each of the plurality of micromechanical elements is disposed within one of said metal housings. Each housing preferably has a metal roof and at least one metal wall, and the metal roof and metal wall preferably comprise copper. Each of the housings is preferably hermetically sealed and is preferably separated from each other housing by a flattened portion of metal having some of said portion of solder disposed thereon so that, after solder reflow, the structure can be diced without compromising the seal.

These and other aspects of the present disclosure are described in greater detail below.

BRIEF DESCRIPTION OF THE DRAWINGS

FIGS. 2–6 are cross-sectional illustrations depicting a method for making a lid for a MEMS semiconductor device in accordance with the teachings herein;

DETAILED DESCRIPTION

It has now been found that the foregoing needs may be met by forming a housing array (that is, an array of housing elements) as a separate cohesive or unitary structure, which may then be positioned on a wafer or other substrate such that each housing element in the array is positioned over one or more micromachined devices or features on the substrate. The housing array may then be attached to the substrate so as to form an array of hermetically sealed structures, after which the structures may be isolated from the array through dicing or by other appropriate methods.

Figure 1:
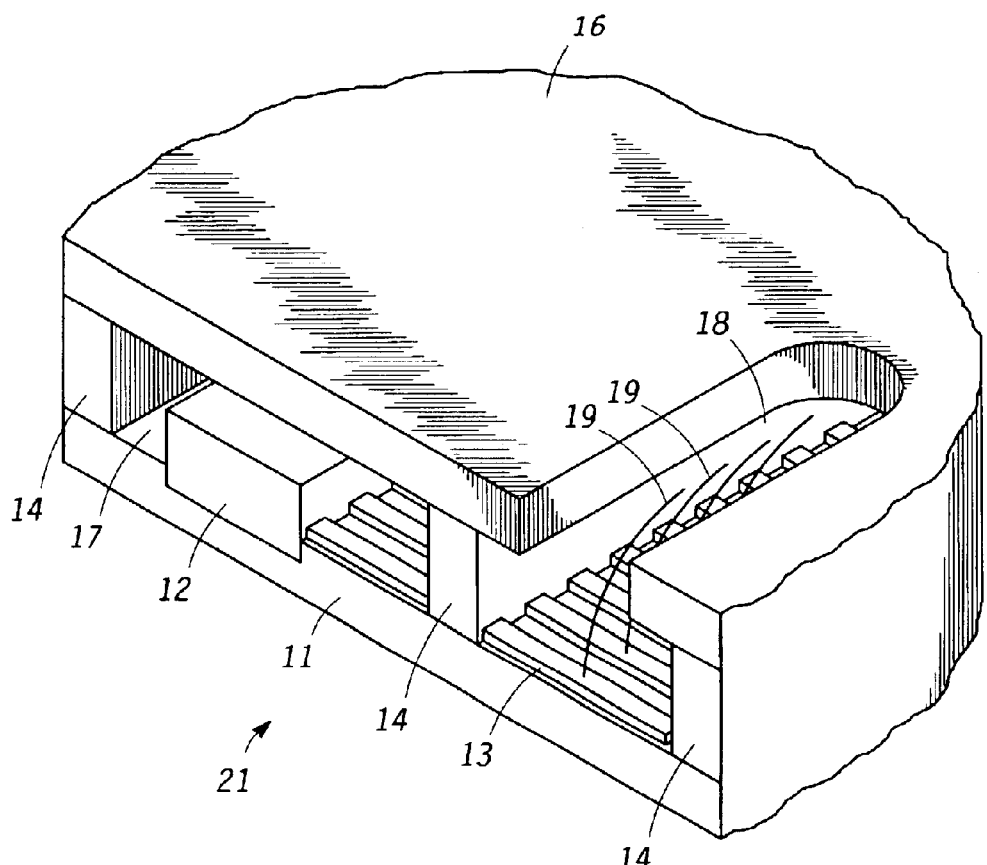
FIG. 1 is a cross-sectional illustration of a prior art semiconductor wafer level package.
Figure 2:
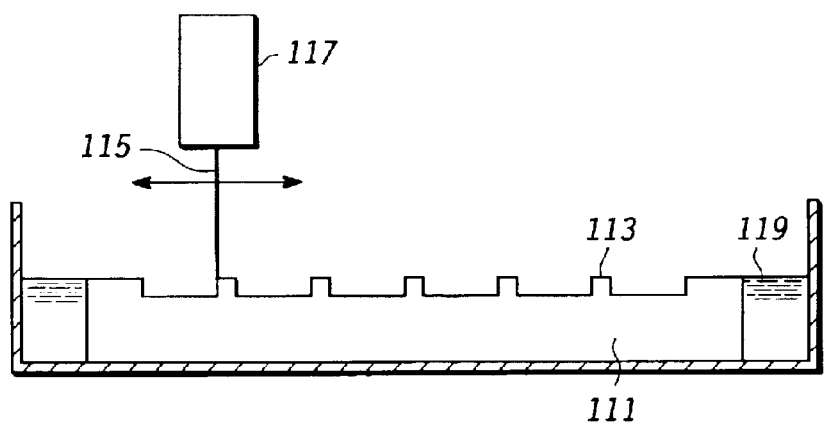

FIGS. 2–6 illustrate one embodiment of a method that may be used to make a housing array for a micromachined device in accordance with the teachings herein. As shown in FIG. 2, a substrate 111 having a patterned surface 113 is formed by scanning the beam 115 of a laser 117 back and forth across a bath 119 that contains a polymeric material suspended in solution. The polymeric material in the bath is a substance, such as PMMA (polymethylmethacrylate), which is capable of undergoing a cross-linking reaction upon exposure to the wavelengths of light emitted by the laser. As the polymeric material undergoes crosslinking, it becomes insoluble in the solution and deposits out. Hence, by carefully controlling the sweep of the laser beam, a substrate having a patterned surface of almost any desired design may be built up a layer at a time (in the present embodiment, the substrate will be patterned with the negative replica of a housing array suitable for encapsulating a series of micromechanical devices). The laser will typically be controlled by a computer, which may generate a patterned substrate based on a CAD drawing or other such input. The substrate formed with the laser is then removed from the bath for further processing.

As shown in FIG. 3, the patterned surface 113 of the substrate 111 is then coated, through sputtering or by another suitable process, with a seed metallization 121 to provide the requisite electrical contact for subsequent plating operations. This seed metallization is preferably gold, although other suitable metals may also be used for this purpose as are known to the art. Moreover, the seed metallization may have a single layer or multilayer structure. Examples of a multilayer seed metallization include, for instance, TiW/Cu.

With reference to FIG. 4, after the seed metallization 121 is deposited, a structural material layer 123 of a material such as copper is electroplated onto the seed metallization, typically to a thickness of about 8–10 mil (203–254 microns). The structural metal layer provides sufficient structural integrity such that the housing array can be handled as an isolated structure. Next, a layer of solder 125 is electroplated onto the structural material layer 123, typically to a thickness of about 1–2 mil (25–51 microns). Preferably, the solder used for this purpose is a lead-free solder such as SnCu, SnAg or SrAgCu, although tin-lead solders and other such solders as are known to the art may also be used.

Figure 8:
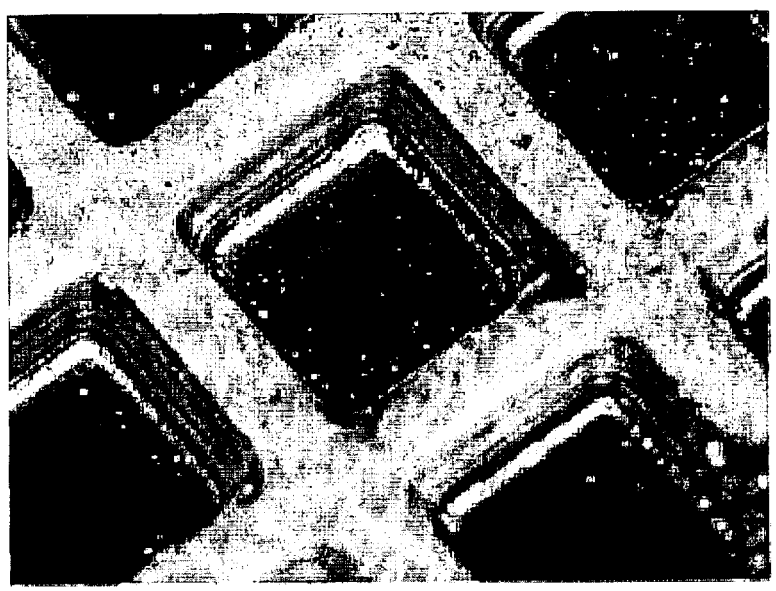
FIG. 8 is a micrograph showing a perspective view of a patterned copper array after release from a PMMA substrate.

As shown in FIG. 5, the resulting structure is then subjected to thermal cycling to allow the seed metallization 121, the structural material layer 123 and the layer of solder 125 to be removed from the substrate 111 as a cohesive mass 127 which defines a housing array. Preferably, the substrate comprises a material that undergoes thermal softening upon exposure to heat to facilitate removal of the housing array from the substrate during this process. An actual example of such a housing array as it appears at this point in the process is shown in the micrograph of FIG. 8, where it is seen that each housing in the array is bounded by a flattened section that separates it from adjacent housings.

Figure 7:
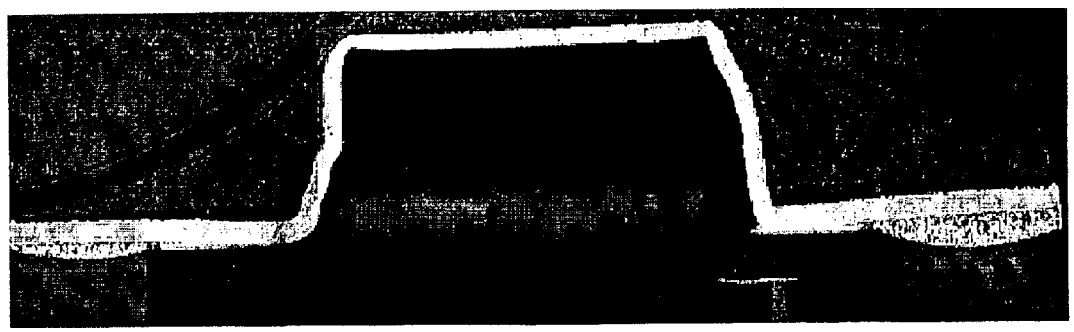
FIG. 7 is a cross-sectional micrograph of a hermetically sealed package made in accordance with the teachings herein.

The solder present on the housing array 127 is then prepared for reflow by treating it with a fluorinated plasma or by another dry flux procedure. As shown in FIG. 6, the housing array is then placed on a second substrate 129 such that the solder present on the metal structure is in contact with the surface of the second substrate. The second substrate will typically contain a series of micromechanical features or devices, such as RF MEMS switches, each of which is to be hermetically sealed in a package. The housing array 127 is then positioned on the second substrate such that each micromechanical feature or structure is enclosed in a housing element formed in the housing array. The solder is then reflowed, thus hermetically sealing each micromechanical feature or device in a package formed by the housing array and the underlying substrate. FIG. 7 shows a cross-sectional micrograph of an actual example of such a package as it appears after solder reflow.

Figure 9:
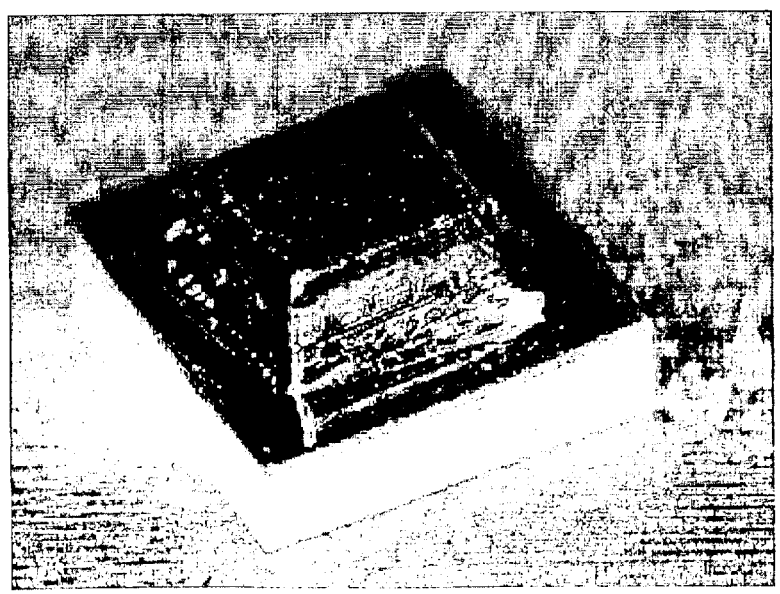
FIG. 9 is a singular hermetically sealed RF MEMS device formed by sawing a sealed array into discrete parts.

After the housing array is adhered to the second substrate, the second substrate may be sawn or diced to produce a plurality of singular packages. The micrograph of FIG. 9 shows an actual example of one such package as it appears after dicing. The individual packages may then be incorporated into various products and semiconductor devices.

In the methods and devices described above, the solder used to achieve a hermetic seal is plated onto the surface of the structural material that is used to define the housing elements for the micromachined elements disposed on the second substrate. However, one skilled in the art will appreciate that the solder may also be applied by other means. For example, the solder could be applied to the second substrate prior to application of the housing array. This may be accomplished through the use of solder preforms, or by selective solder deposition using various masking techniques.

Moreover, the methodology disclosed herein is not particularly limited to the use of solder as the sealing agent to form a hermetic seal between the housing array and the second substrate. Rather, other sealing agents may be used in place of solder in the methodologies described herein. These sealing agents include, for example, polymeric adhesives, including hermetic epoxies, and glasses, including borosilicate frit glasses. However, the use of solder as the adhesive is preferred because of the unique advantages it offers. For example, many solders can be conveniently plated onto the structural material of the housing array using well-known plating techniques. Since the structural material of the housing array may itself be plated, a solder plating step can be readily integrated into the process used to define the array. Moreover, the use of solders allows the hermetically sealed device to be reworked if it proves to be defective. This can be accomplished by subjecting the solder to reflow and then removing the housing. Indeed, if a substantial number of devices are found to be defective at the array level, the entire metal structure can be removed from the array and the defective devices can be reworked, after which the housing array can be reattached to the second substrate.

The methods described herein are also not limited to any particular process which may be used to form or pattern the first substrate. Thus, for example, while it is preferred that the first substrate is both formed and patterned through laser-induced deposition of a polymeric material from solution, if the first substrate comprises a thermoformable material, it could also be formed or patterned through the use of various thermoforming operations as are known to the art. This approach is particularly useful if the first substrate comprises a thermoplastic. Examples of possible thermoplastics that the first substrate may be made out of include, but are not limited to, polyolefins (including, for example, polyethylene and polypropylene), and polyesters (including, for example, polyethylene naphthalate and polyethylene terephthalate). The first substrate may also be made out of thermosetting materials, such as, for example, various polyacrylates.

It will also be appreciated that the first substrate may be formed from materials that are not thermoformable, and through the use of methods other than thermoforming. For example, the first substrate could be formed from a material that may be dissolved or otherwise removed after formation of the housing array. In one such embodiment, for example, the first substrate could be formed from a layer of sacrificial oxide that has been suitably patterned. After formation of the housing array on the first substrate, the sacrificial oxide layer could then be removed through the use of an aqueous solution of an acid such as HCl to release the structure. The first substrate could also be formed through various vapor deposition techniques, or through various combinations of known fabrication methodologies.

Moreover, the housing array may be fabricated from a wide variety of materials, and through the use of various methodologies. Thus, while it is preferred that the housing array is made via an electroplating process and thus comprises materials, such as copper, that can be readily electroplated, the housing array may also be formed through other processes. For example, the housing array may be formed by pressing, stamping, etching, embossing, or otherwise treating various substrates to create housing elements on them. If such other techniques are used to define the housing array, the ability of the structural material to be plated may no longer be a primary consideration, and materials other than copper may be preferred for the structural material. Such other materials may include, for example, Fe—Ni—Co alloys such as those sold under the trade name Kovar®, and polymers filled with metals, carbon black, or other electrically or thermally conductive materials.

The housing array may also be applied to various second substrates to form hermetically sealed devices. Some non-limiting examples of such second substrates include organic substrates, such as, for example, grade FR4 copper laminate epoxy glass substrates; ceramic substrates, such as, for example, Low Temperature Co-fired Ceramic (LTCC) or aluminum oxide substrates; semiconductor substrates, such as, for example, silicon, GaAs, InP, or SiGe substrates; metal substrates, such as, for example, copper and gold substrates; and various dielectric substrates.

It will also be appreciated that the housing arrays described herein are not limited to any particular number of layers. Thus, while it is preferred that the array includes a seed metallization, a structural material layer, and a solder layer, either or both of the seed metallization and solder layers could be eliminated from the array depending on the method used to fabricate it. Moreover, the structural material layer itself could comprise multiple layers of the same or different metals.

A method and apparatus have been provided herein for encapsulating a micromachined device or element. The method utilizes a first, patterned substrate to define an array of housing elements for micromechanical features, which array can then be removed from the first substrate as a cohesive mass. The array, which preferably includes a layer of solder, can then be used in a subsequent reflow operation to encapsulate a series of micromechanical elements disposed on a second substrate, after which the resulting device may be diced into individual packages.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for encapsulating a micromechanical device, comprising the steps of:

providing a first substrate having a plurality of micromechanical features disposed thereon;

forming a structure, apart from the first substrates which comprises an array of housing elements; and positioning the structure over the first substrate such that each micromechanical feature on the first substrate is disposed within a housing element of the array;

wherein the structure is formed by the steps of:

(a) providing a second substrate having a patterned surface, (b) forming a metal layer on the second substrate such that a negative replica of the patterned surface is imparted to the metal layer, and (c) removing the metal layer from the second substrate.

2. The method of claim 1, further comprising the step of adhering the structure to the first substrate such that each of the plurality of micromechanical features is hermetically sealed within a housing element.

3. The method of claim 2, wherein the structure has a layer of solder disposed thereon, and wherein the structure is adhered to the first substrate by reflowing the solder.

4. The method of claim 2, further comprising the step of dividing the array and first substrate into separate hermetically sealed units such that each unit contains exactly one housing element.

5. The method of claim 1, wherein the structure comprises a metal.

6. The method of claim 1, wherein each housing element in the array is separated from each other housing element in the array by a flat section.

7. The method of claim 1, further comprising the step of electroplating a solder onto the metal layer.

8. A method for encapsulating a micromechanical device, comprising the steps of:

providing a first substrate having a patterned surface;

depositing a seed metallization over the patterned surface;

electroplating a metal structural layer onto the seed metallization;

electroplating a solder over the structural layer;

removing at least the structural layer and solder from the first substrate as a cohesive mass which forms an array of housing elements; and using the structural layer to encapsulate a micromechanical device.

9. The method of claim 8, wherein the first substrate comprises a thermoformable material.

10. The method of claim 9, wherein the metal layer is removed from the first substrate by exposing the substrate to heat.

11. The method of claim 10 wherein, after the metal layer is removed from the first substrate, it contains a negative replica of the patterned surface.

12. The method of claim 8, wherein the first substrate comprises PMMA.

13. The method of claim 8, wherein the seed metallization comprises gold.

14. The method of claim 8, wherein the metal structural layer comprises copper.

15. The method of claim 9, wherein the solder comprises SnCu.

16. The method of claim 8, further comprising the steps of:

placing the cohesive mass on a second substrate such that the solder is in contact with the second substrate; and reflowing the solder.

17. The method of claim 16, wherein the second substrate is a semiconductor wafer.

18. The method of claim 17, wherein the semiconductor wafer has a plurality of micromechanical features defined thereon.

19. A method for encapsulating a micromechanical element, comprising the steps of:

providing a first substrate having a patterned surface;

depositing a first metal layer onto the patterned surface;

electroplating a second metal layer onto the first metal layer;

electroplating a layer of solder onto the second metal layer;

removing, as a cohesive structure, the first and second metal layers and the solder layer from the first substrate;

placing the structure on a second substrate having at least one micromechanical structure disposed thereon such that the solder is in contact with the second substrate; and reflowing the solder.

20. A method for encapsulating a micromechanical element, comprising the steps of:

providing a patterned substrate;

using the substrate to define an array of metal housings;

disposing a portion of solder onto a surface of the array;

removing the array from the patterned substrate as a cohesive mass;

placing the array on a second substrate having a plurality of micromechanical structures defined thereon such that each of the plurality of micromechanical elements is disposed within one of the metal housings within the array; and reflowing the solder.

21. The method of claim 20, wherein the step of using the substrate to define an array of metal housings involves plating a metal onto the substrate.

22. The method of claim 20, wherein the step of reflowing the solder results in the formation of a hermetic seal between at least one of the metal housings and the second substrate.

23. The method of claim 20, wherein the second substrate is a semiconductor wafer.

24. The method of claim 20, wherein the patterned substrate comprises a thermoformable material.

25. The method of claim 24, wherein the array is removed from the patterned substrate by exposing the patterned substrate to heat.

26. The method of claim 20, wherein the patterned substrate has a patterned surface, and wherein, after the metal layer is removed from the patterned substrate, it contains a negative replica of the patterned surface.

27. The method of claim 20, wherein the patterned substrate comprises PMMA.

28. The method of claim 20, wherein the metal housings comprise copper.

29. The method of claim 20, wherein the second substrate is a semiconductor wafer.

30. The method of claim 19, wherein the step of reflowing the solder hermetically seals the micromechanical structure within a housing defined by the structure and the second substrate.

31. The method of claim 19, further comprising the step of dividing the structure and the second substrate into separate hermetically sealed units.

32. The method of claim 19, wherein each unit is separated from each other unit by a flat section.

33. The method of claim 19, wherein the structure is removed from the first substrate by exposing the first substrate to heat.

34. The method of claim 19, wherein the first substrate comprises a thermoformable material.

35. The method of claim 19, wherein the first substrate comprises PMMA.

36. The method of claim 19 wherein, after the structure is removed from the first substrate, it contains a negative replica of the patterned surface.

37. The method of claim 19, wherein the second metal is copper.

38. The method of claim 19, wherein the first metal comprises gold, the second metal comprises copper, and the solder comprises SnCu.

39. The method of claim 19, wherein the second substrate is a semiconductor wafer having first and second micromechanical features thereon, wherein the structure comprises an array of first and second housing elements, and wherein the structure is placed on the second substrate such that the first housing element is disposed over the first micromechanical feature, and the second housing element is disposed over the second micromechanical feature.

40. The method of claim 1, wherein the structure is removed from the second substrate by exposing the second substrate to heat.

41. The method of claim 1, wherein the second substrate comprises a thermoformable material.

42. The method of claim 1, wherein the second substrate comprises PMMA.

43. The method of claim 1, wherein the first substrate is a semiconductor wafer.

* * * * *

UNITED STATES PATENT AND TRADEMARK OFFICE
CERTIFICATE OF CORRECTION

PATENT NO. : 6,949,398 B2 Page 1 of 1
APPLICATION NO. : 10/286441
DATED : September 27, 2005
INVENTOR(S) : William H. Lytle It is certified that error appears in the above-identified patent and that said Letters Patent is hereby corrected as shown below:

In Column 8, Line 13, Claim No. 1:

Change "substrates" to -- substrate--.

Signed and Sealed this

Twenty-first Day of November, 2006

JON W. DUDAS
*Director of the United States Patent and Trademark Office*